(12) United States Patent
Kajii

(10) Patent No.: US 6,315,185 B2
(45) Date of Patent: *Nov. 13, 2001

(54) BALL MOUNT APPARATUS

(75) Inventor: Yoshihisa Kajii, Ishikawa (JP)

(73) Assignee: Shibuya Kogyo Co., Ltd., Ishikawa (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/415,224

(22) Filed: Oct. 12, 1999

(30) Foreign Application Priority Data

Dec. 1, 1998 (JP) .................................. 10-356979

(51) Int. Cl.$^7$ .................................. B23K 15/00
(52) U.S. Cl. .................... 228/8; 228/12; 228/495
(58) Field of Search .................. 228/246, 245, 228/244, 121.1, 123.1, 178, 179.1, 180.21, 180.22, 8, 12, 49.5; 221/211; 269/903

(56) References Cited

U.S. PATENT DOCUMENTS

| | | | |
|---|---|---|---|
| 5,435,482 | * 7/1995 | Variot et al. | 228/254 |
| 5,467,913 | * 11/1995 | Namekawa et al. | |
| 5,601,229 | * 2/1997 | Nakazato et al. | |
| 5,620,927 | * 4/1997 | Lee | 29/841 |
| 5,626,277 | * 5/1997 | Kawada | 228/41 |
| 5,831,247 | * 11/1998 | Hidaka | |
| 5,890,283 | * 4/1999 | Sakemi et al. | |
| 5,956,134 | * 9/1999 | Roy et al. | |
| 5,989,937 | * 11/1999 | Variot et al. | 438/108 |
| 6,048,750 | * 4/2000 | Hembree | 438/107 |
| 6,070,783 | * 6/2000 | Nakazato | |
| 6,109,509 | * 8/2000 | Sakai et al. | |

* cited by examiner

Primary Examiner—Tom Dunn
Assistant Examiner—Jonathan Johnson
(74) Attorney, Agent, or Firm—Sughrue, Mion, Zinn, Macpeak & Seas, PLLC

(57) ABSTRACT

In a ball mount apparatus for mounting balls on a work by means of a mount head, the work is disposed under the mount head and the mount head is provided with a Z-axis driving mechanism for driving the mount head only in an up/down direction. A ball tray for storing the balls is disposed at a height between the mount head and the work and provided with a driving mechanism for reciprocating between a ball sucking position under the mount head and a stand by position.

7 Claims, 3 Drawing Sheets

BALL MOUNT APPARATUS

BACKGROUND OF THE INVENTION

1. Field of the Invention

The present invention relates to the improvement of a ball mount apparatus. The invention has been developed with a primary object of a BGA (ball grid array) ball mount apparatus for sucking solder balls, which will become terminals on a circuit surface of a BGA substrate, onto a mount head so as to mount the solder balls on the BGA substrate.

The present application is based on Japanese Patent Application No. Hei. 10-356979, which is incorporated herein by reference.

2. Description of the Related Art

In a background-art ball mount apparatus, a mount head is moved not only vertically but also horizontally. That is, the mount head is moved down to a ball tray position so as to suck solder balls, moved to a pickup inspection unit for inspection, and thereafter further moved to a ball mount position so as to mount the solder balls on a BGA substrate. Further, if necessary, the BGA substrate is inspected in parallel with the ball pickup inspection.

According to such a mechanism, the mount head is moved on a plane frequently. Therefore, if the cycle time was shortened, there arose a defect that the accuracy of positioning the mount head deteriorated. On the contrary, if the positioning accuracy was improved, there arose a problem that the cycle time was prolonged.

SUMMARY OF THE INVENTION

It is an object of the invention to provide a ball mount apparatus which can mount solder balls with a high accuracy of positioning and at a high speed, without necessity for a mount head to move on a plane (movement in X-axis and Y-axis directions) between a ball tray position and a ball mount position.

It is another object of the invention to provide a ball mount apparatus which can suck balls, inspect missing balls and double balls and mount the balls at a high speed and with a high accuracy, only on a Z-axis without necessity for a mount head to move on a plane.

It is still another object of the invention to provide a ball mount apparatus which can position a work, suck balls, inspect missing balls and double balls and mount the balls at a high speed and with a high accuracy, only on a Z-axis without necessity for a mount head to move on a plane.

In order to achieve the above problems, the present invention employs the following means. That is, according to the first aspect of the invention, there is provided a ball mount apparatus for mounting balls on a work by means of a mount head; wherein the work is disposed under the mount head; wherein the mount head is provided with a Z-axis driving mechanism for driving the mount head only in an up/down direction; wherein a ball tray for storing the balls is disposed at a height between the mount head and the work; and wherein the ball tray is provided with a driving mechanism for reciprocating between a ball sucking position under the mount head and a stand by position.

According to the second aspect of the invention, there is provided a ball mount apparatus for mounting balls on a work by means of a mount head; wherein the work is disposed under the mount head; wherein the mount head is provided with a Z-axis driving mechanism for driving the mount head only in an up/down direction; wherein a ball tray for storing the balls is disposed on a support base disposed at a height between the mount head and the work; wherein a missing ball inspection unit and a double ball inspection unit are provided on the support base; and wherein the support base is provided with a driving mechanism for reciprocating between a ball sucking position under the mount head and a stand by position.

According to the third aspect of the invention, there is provided a ball mount apparatus for mounting balls on a work on a substrate stage by means of a mount head; wherein the substrate stage is provided with a positioning driving mechanism; wherein the mount head is provided with a Z-axis driving mechanism for driving the mount head only in an up/down direction; wherein a support base for a ball tray and a substrate recognition camera are disposed at a height between the mount head and the work so that the support base and the substrate recognition camera do not interfere with each other; wherein the ball tray for storing balls, a missing ball inspection unit and a double ball inspection unit are provided on the support base; wherein the support base is provided with a driving mechanism reciprocating between a ball sucking position under the mount head and a stand by position; and wherein the substrate recognition camera is provided with a horizontally driving mechanism for reciprocating with respect to at least one axis between a position above the substrate stage and the stand by position.

Features and advantages of the invention will be evident from the following detailed description of the preferred embodiments described in conjunction with the attached drawings.

DETAILED DESCRIPTION OF THE PREFERRED EMBODIMENTS

Figure 1:
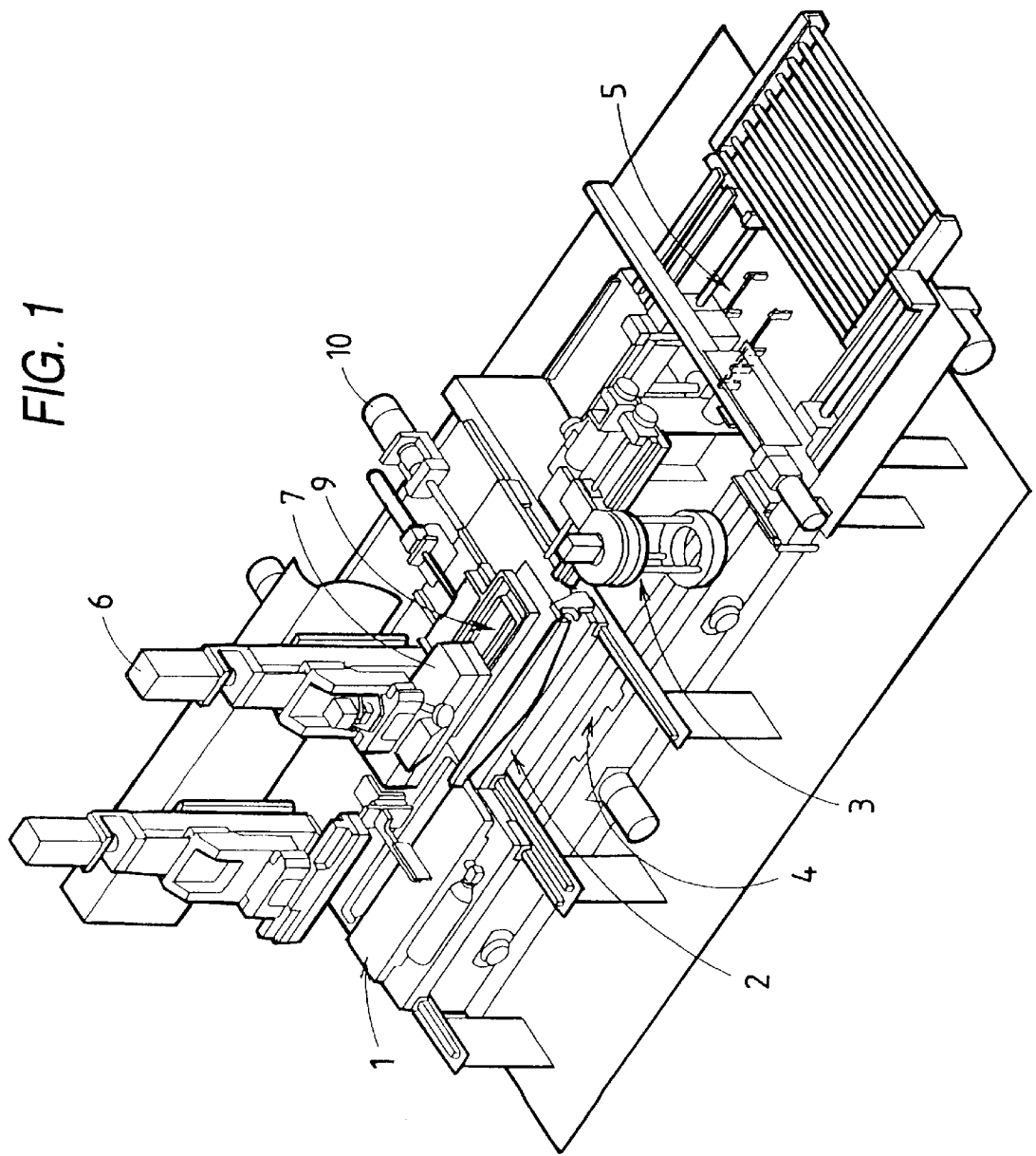
FIG. 1 is an explanatory view showing the whole of a mounter.

Description will be made below about a mode for carrying out the invention together with embodiments shown in the drawings. FIG. 1 is an explanatory view showing the whole of a ball mounter to which the present invention is applied. In the illustrated embodiment, the ball mounter is a BGA solder ball mounter.

The BGA solder ball mounter comprises a flux supply unit 1 for transferring flux onto a BGA substrate 15 which will become a work, a ball mount apparatus 2 for mounting solder balls on the BGA substrate 15 (see FIG. 2), a mount inspection unit 3 for making an inspection by using a CCD camera as to whether the solder balls are properly mounted or not, a conveyor unit 4 for conveying the BGA substrate 15 from the flux supply unit 1 to the ball mount apparatus 2 and the mount inspection unit 3, and a carry-out unit 5 for carrying-out the BGA substrate 15 after the inspection is completed.

The BGA substrate 15 is supplied onto a conveyor (not shown) of the conveyor unit 4 by a not-shown carry-in unit. The conveyor conveys the BGA substrate 15 to the flux supply unit 1. After flux is transferred to the BGA substrate 15, the BGA substrate 15 is conveyed to the ball mount apparatus 2.

Figure 2:
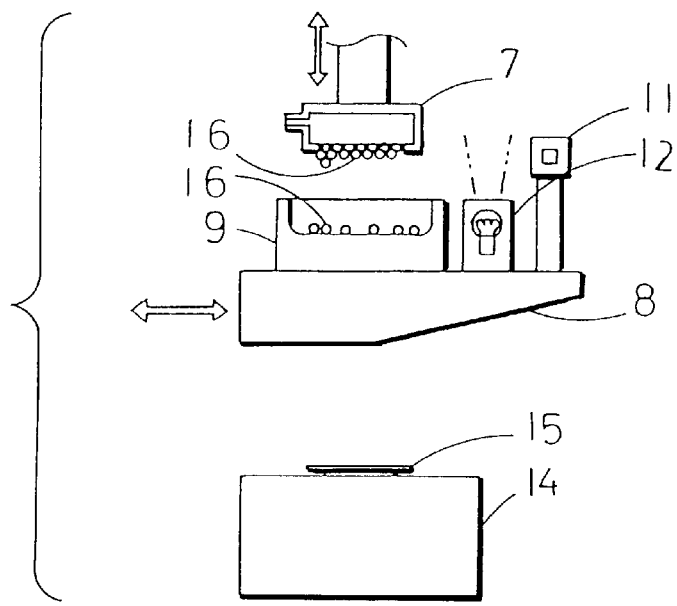
FIG. 2 is a schematic explanatory view showing a first embodiment of a ball mount apparatus.
Figure 3:
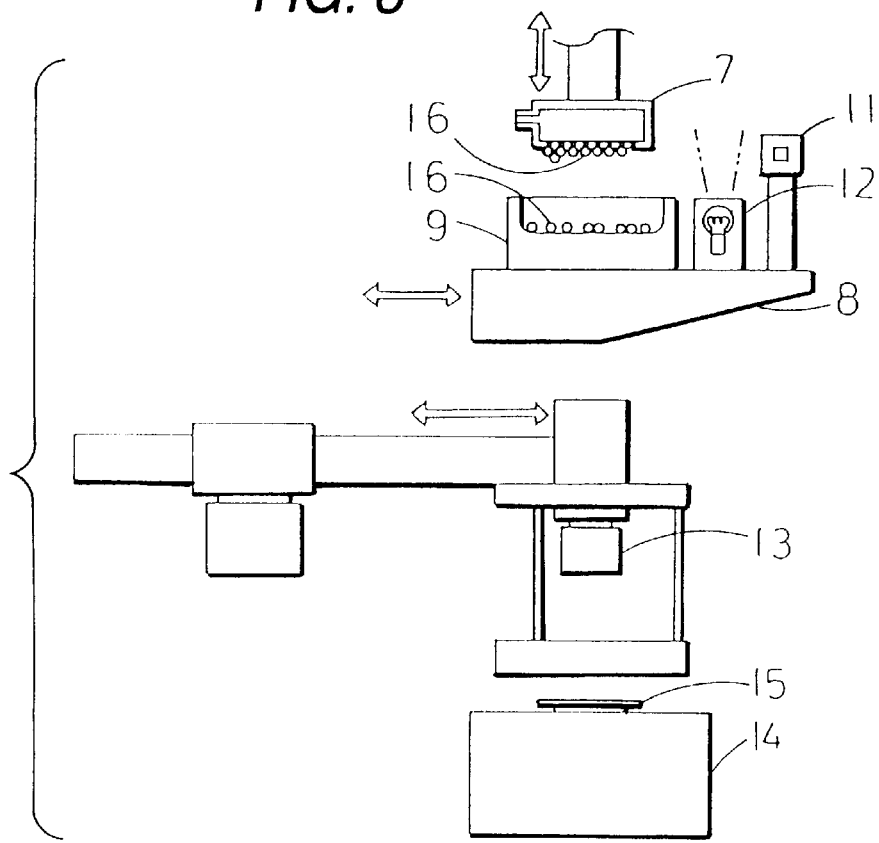
FIG. 3 is a schematic explanatory view showing a second embodiment of a ball mount apparatus.

The present invention appears in the ball mount apparatus 2. The ball mount apparatus 2 is configured to make a mount head 7 suck solder balls 16 from a ball tray 9 to thereby mount the solder balls 16 on the BGA substrate 15 which is located on a substrate stage 14. FIG. 2 is a schematic explanatory view of a first embodiment according to the present invention, and FIG. 3 is a schematic explanatory view of a second embodiment in which a substrate recognition camera 13 is added to the first embodiment.

Although the mount head 7 is similar to a background-art mount head, the mount head 7 is characterized in that only a Z-axis driving mechanism is provided. The reference numeral 6 in FIG. 1 represents a head elevating motor which is to bear the driving power of the Z-axis driving mechanism. The mount head 7 is allowed to move up/down only in the Z-axis direction (up/down direction) between an upper stand by position and the BGA substrate 15 on the substrate stage 14 by the head elevating motor 6, as shown by the arrows in FIGS. 2 and 3.

Figure 4:
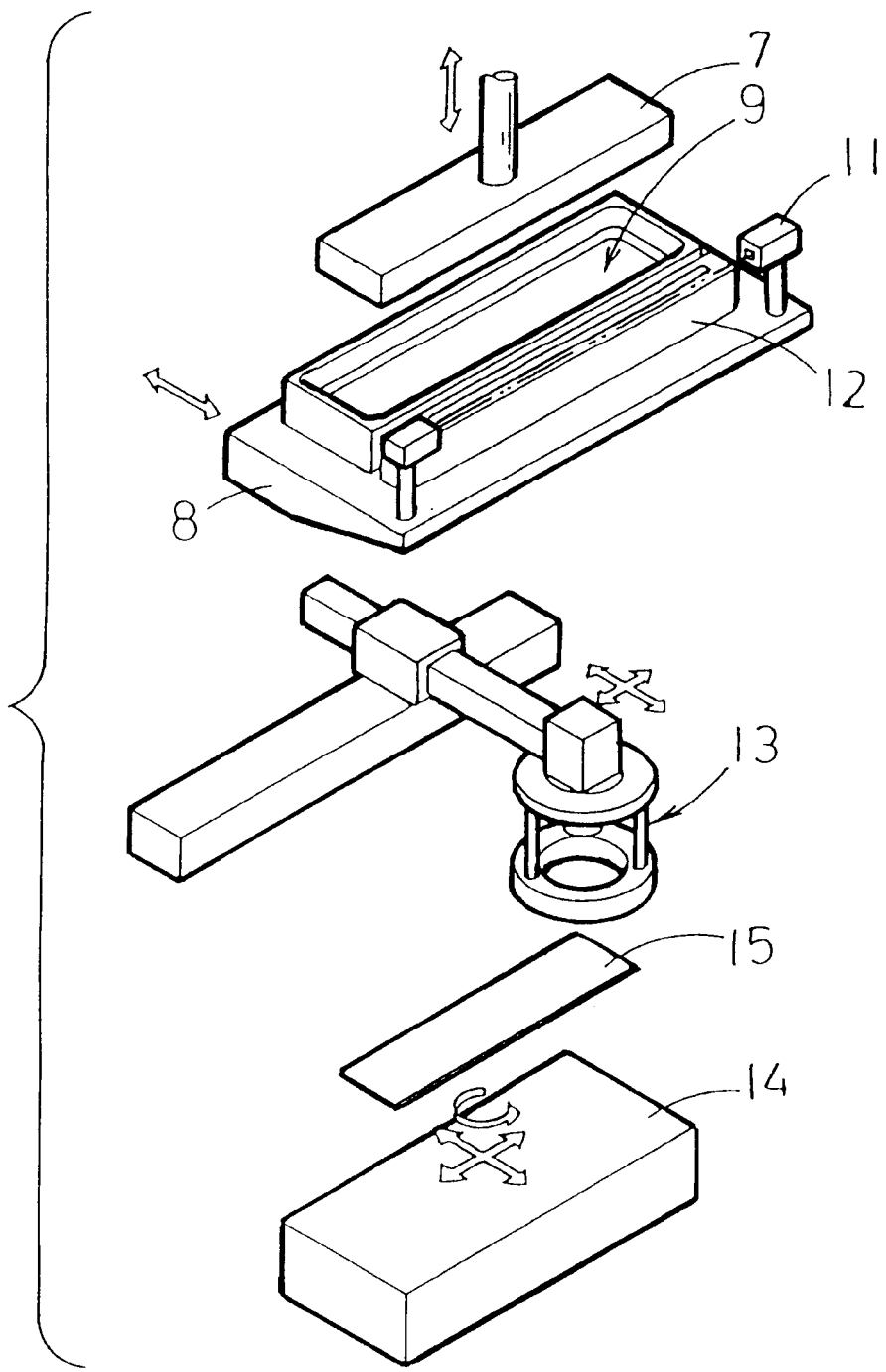
FIG. 4 is a schematic perspective view of a ball mount apparatus.

The substrate stage 14 shown in FIG. 2 is subjected to positional adjustment in advance relatively to the mount head 7 so that the BGA substrate 15 is set to be located under the mount head 7. In the case where a substrate recognition camera 13 is disposed as shown in FIGS. 3 and 4, X-axis, Y-axis and a rotation Θ-axis driving mechanisms for correcting the positioning are provided in the substrate stage 14.

The ball tray 9 for storing the solder balls 16 is provided with an Y-axis driving mechanism as a driving mechanism for reciprocating between a ball sucking position and the stand by position. Although a reciprocating driving mechanism by means of rotation or the like can be also considered as the driving mechanism, the Y-axis driving mechanism is adopted in the embodiment. The Y-axis driving mechanism is allowed to move the ball tray 9 only in the Y-axis direction (the left/right direction shown by the arrows in FIGS. 2 and 3) by means of a ball tray moving motor 10 (see FIG. 1). The ball tray 9 is allowed to reciprocate between the solder ball sucking position under the mount head 7 and the stand by position by means of the ball tray moving motor 10. The ball tray 9 is located in the stand by position in FIG. 1, while the ball tray 9 is located in the solder ball sucking position under the mount head 7 in FIGS. 2 and 3.

The ball tray 9 is attached to a support base 8 moved by the ball tray moving motor 10. This support base 8 is provided with a missing ball inspection unit 12 and a double ball inspection unit 11 as well as the ball tray 9. In the case where the support base 8 takes refuge from the solder ball sucking position to the left, the ball tray 9, the missing ball inspection unit 12 and the double ball inspection unit 11 are arranged in the order from the left, as shown in FIGS. 2 and 3. That is, the missing ball inspection unit 12 and the double ball inspection unit 11 are arranged to pass under the mount head 7 after the mount head 7 sucks the solder balls 16. As described above, a precision motor is required as the ball tray moving motor 10 of the Y-axis driving mechanism because it is also used for inspection.

The support base 8 is disposed at a height between the mount head 7 and the BGA substrate 15. Under the support base 8, the substrate recognition camera 13 is also disposed at a height between the mount head 7 and the BGA substrate 15.

The substrate recognition camera 13 can move in the X-axis and Y-axis directions as shown in FIG. 4. Two axes are required for high resolution because it is necessary to pick up an enlarged image for every corner. If high resolution is not required, the substrate recognition camera 13 may be made movable only in a single-axis direction so as to pick up an image of the whole of the BGA substrate 15 by one shot.

Though not shown in the drawing, if a solder ball recognition camera for detecting solder balls on the mount head 7 and the substrate recognition camera 13 are disposed between the mount head 7 and the BGA substrate 15, the solder balls 16 and lands of the BGA substrate 15 can be recognized simultaneously so that the solder balls 16 can be mounted on the lands.

Description will be made below about the procedure of operation of the embodiment having the substrate recognition camera 13. The BGA substrate 15 is supplied to the substrate stage 14 by the conveyor unit 4, and the ball tray 9 is moved from the stand by position to the ball sucking position under the mount head 7 by the Y-axis driving mechanism. The mount head 7 once moves down so as to suck the solder balls 16, which are in the ball tray 9, by vacuum, and then moves up to the ball inspection height.

After that, the support base 8 of the ball tray 9 moves from a position under the mount head 7 toward the stand by position. During this movement, missing balls are first inspected by the missing ball inspection unit 12, and the double balls are inspected by the double ball inspection unit 11. If an abnormality is detected, the operation of sucking the solder balls 16 is performed again. If there is no abnormality, the support base 8 moves to the stand by position.

On the other hand, during the inspection for missing balls and double balls, the substrate recognition camera 13 goes above the substrate stage 14 so as to perform image recognition of the BGA substrate 15 on the substrate stage 14. By moving the respective axes of X, Y and Θ of the substrate stage 14, the positions of the solder balls 16 on the mount head 7 are made to accord with the pattern of the BGA substrate 15 so that the positioning of the BGA substrate 15 is corrected. After the ball tray 9 and the substrate recognition camera 13 have taken refuge, the mount head 7 moves down to the BGA substrate 15 so as to mount the solder balls 16 on the BGA substrate 15.

When the ball mount is finished, the BGA substrate 15 is delivered to the mount inspection unit 3. In the mount inspection unit 3, judgment is made by a CCD camera whether the mount has been carried out properly or not. After the inspection is finished, the work is carried out by a work holding member which is provided in the carry-out unit 5.

Since the present invention is configured as described above, it has effects as follows.

The mount head 7 is provided with a Z-axis driving mechanism for driving a mount head only in the up/down direction so that the mount head is not allowed to move on a plane, that is, in the X-axis and Y-axis directions. Accordingly, it is possible to realize a ball mount apparatus with a high accuracy including no stop accuracy in these X-axis and Y-axis directions. It is therefore possible to allow the mount head to have a high-speed driving system, so that it is also possible to make the ball mount apparatus operate at a high speed.

Further, the mount head is provided with a Z-axis driving mechanism for driving a mount head only in the up/down direction, and a ball tray, a missing ball inspection unit and a double ball inspection unit are provided on a support base disposed at a height between the mount head and a work, so that ball sucking, inspection of missing balls and double balls, and ball mount can be achieved on a single axis.

Accordingly, it is possible to make the ball mount apparatus operate at a high speed and with a high accuracy.

Further, a positioning driving mechanism is provided in a substrate stage, a Z-axis driving mechanism for driving a mount head only in the up/down direction is provided in the mount head, a support base and a substrate recognition camera are disposed at a height between the mount head and a work, and a ball tray, a missing ball inspection unit and a double ball inspection unit are provided on the support base, so that positioning of the work, ball sucking, inspection of missing balls and double balls, and ball mount can be achieved on a single axis. Accordingly, it is possible to provide a ball mount apparatus operating at a high speed and with a high accuracy.

And the support base and the substrate recognition camera are disposed so as not to interfere with each other. Accordingly, the mount head can correct the position of the work through the substrate recognition camera during the ball sucking operation of the mount head. It is therefore possible to mount balls at a high speed.

Although the invention has been described in its preferred form with a certain degree of particularity, it is understood that the present disclosure of the preferred form can be arrangement of parts without departing from the spirit and the scope of the invention as hereinafter claimed.

What is claimed is:

1. A ball mount apparatus for mounting balls on a work, comprising:
   a mount head for sucking the balls, the work being disposed under said mount head;
   a driving mechanism for driving said mount head, wherein said mount head moves only in an up/down direction;
   a ball tray for storing the balls, said ball tray being disposed between said mount head and the work; and
   a driving mechanism for reciprocating said ball tray between a ball sucking position under said mount head and a stand by position.

2. A ball mount apparatus for mounting balls on a work, comprising:
   a mount head for sucking the balls, the work being disposed under said mount head;
   a driving mechanism for driving said mount head, wherein said mount head moves only in an up/down direction;
   a support base disposed between said mount head and said work;
   a ball tray for storing the balls, said ball tray being disposed on said support base;
   at least one inspection unit for inspecting a failure of suction of the balls by said mount head, said inspection unit being disposed on said support base; and
   a driving mechanism for reciprocating said support base between a ball sucking position under said mount head and a stand position.

3. A ball mount apparatus according to claim 2, wherein said inspection unit includes a missing ball inspection unit and a double ball inspection unit.

4. A ball mount apparatus for mounting balls on a work, comprising:
   a mount head for sucking the balls;
   a Z-axis driving mechanism for driving said mount head only in an up/down direction;
   a substrate stage on which the work is disposed;
   a positioning driving mechanism for positioning said substrate stage;
   a substrate recognition camera for recognizing an image of the work, said substrate recognition camera being disposed at a height between said mount head and the work;
   a horizontally driving mechanism for reciprocating said substrate recognition camera between a position above said substrate stage and a first stand by position;
   a support base disposed at a height between said mount head and the work so that said support base and said substrate recognition camera do not interfere with each other;
   a ball tray for storing the balls, said ball tray being disposed on said support base;
   at least one inspection unit for inspecting a failure of suction of the balls by said mount head, said inspection unit being disposed on said support base; and
   a driving mechanism for reciprocating said support base between a ball sucking position under said mount head and a second stand by position.

5. A ball mount apparatus according to claim 4, wherein said inspection unit includes a missing ball inspection unit and a double ball inspection unit.

6. A ball mounting method for mounting balls on a work by means of a mount head, comprising steps of:
   disposing the work under the mount head;
   moving a ball tray for storing the balls to a ball sucking position between the mount head and the work;
   moving down the mount head to suck the balls stored in the ball tray;
   moving up the mount head sucking the balls;
   moving the ball tray from the ball sucking position to the stand by position; and
   moving down the mount head sucking the balls to thereby mount the balls on the work,
   wherein said mount head is only moved in an up/down direction.

7. The ball mount apparatus according to claim 3, wherein the missing ball inspection unit is disposed between the ball tray and the double ball inspection unit.

* * * * *